(12) United States Patent
Oh et al.

(10) Patent No.: US 12,021,167 B2
(45) Date of Patent: Jun. 25, 2024

(54) SEMICONDUCTOR DEVICE PACKAGE AND LIGHT IRRADIATION DEVICE COMPRISING THE SAME

(71) Applicant: LG INNOTEK CO., LTD., Seoul (KR)

(72) Inventors: Jung Hun Oh, Seoul (KR); Ki Cheol Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 814 days.

(21) Appl. No.: 17/057,497

(22) PCT Filed: Apr. 29, 2019

(86) PCT No.: PCT/KR2019/005126
§ 371 (c)(1),
(2) Date: Nov. 20, 2020

(87) PCT Pub. No.: WO2019/231115
PCT Pub. Date: Dec. 5, 2019

(65) Prior Publication Data
US 2021/0210655 A1 Jul. 8, 2021

(30) Foreign Application Priority Data

May 28, 2018 (KR) .......................... 10-2018-0060495

(51) Int. Cl.
*H01L 33/20* (2010.01)
*H01L 33/40* (2010.01)
(Continued)

(52) U.S. Cl.
CPC ............ *H01L 33/20* (2013.01); *H01L 33/405* (2013.01); *H01L 33/58* (2013.01); *H01L 33/62* (2013.01)

(58) Field of Classification Search
None
See application file for complete search history.

(56) References Cited

U.S. PATENT DOCUMENTS

| 2002/0024808 A1* | 2/2002 | Suehiro | ..................... G09F 9/33 362/241 |
| 2002/0079591 A1* | 6/2002 | Sakiyama | ........... H01L 25/0652 257/737 |

(Continued)

FOREIGN PATENT DOCUMENTS

| KR | 10-2008-0004759 A | 1/2008 |
| KR | 10-2010-0057340 A | 5/2010 |

(Continued)

*Primary Examiner* — Evren Seven
*Assistant Examiner* — Cole Leon Lindsey
(74) *Attorney, Agent, or Firm* — Birch, Stewart, Kolasch & Birch, LLP

(57) ABSTRACT

An embodiment discloses a semiconductor device package comprising: a substrate; an electrode disposed on the substrate; a semiconductor device and a protective device which are disposed on the electrode; a dummy electrode disposed on the substrate and spaced apart from the electrode along the edge of the substrate; a reflective member disposed on the dummy electrode and having an outer surface, an inner surface surrounding the semiconductor device and forming a cavity, and a bottom surface facing the substrate; and a light-transmitting member disposed on the reflective member and covering the cavity, wherein the inner surface includes a first surface adjacent to the substrate and a second surface extending from the first surface to the light-transmitting member and having a parabolic shape, and the bottom surface of the reflective member has a first recess disposed on the protective device between the dummy electrode and the inner surface.

18 Claims, 12 Drawing Sheets

(51) Int. Cl.
*H01L 33/58* (2010.01)
*H01L 33/62* (2010.01)

(56) References Cited

U.S. PATENT DOCUMENTS

| | | | |
|---|---|---|---|
| 2006/0060867 A1 | 3/2006 | Suehiro | |
| 2008/0073734 A1* | 3/2008 | Kong | H01L 27/14625 |
| | | | 257/E31.127 |
| 2010/0157446 A1* | 6/2010 | Sander | G02B 13/006 |
| | | | 359/771 |
| 2012/0267671 A1 | 10/2012 | Jung et al. | |
| 2018/0315908 A1* | 11/2018 | Lee | H01L 33/56 |

FOREIGN PATENT DOCUMENTS

| KR | 10-2012-0119153 A | 10/2012 |
|---|---|---|
| KR | 10-1557402 B1 | 10/2015 |

* cited by examiner

SEMICONDUCTOR DEVICE PACKAGE AND LIGHT IRRADIATION DEVICE COMPRISING THE SAME

CROSS REFERENCE TO RELATED APPLICATIONS

This application is the National Phase of PCT/KR2019/005126 filed on Apr. 29, 2019, which claims priority under 35 U.S.C. § 119(a) to Patent Application No. 10-2018-0060495 filed in the Republic of Korea on May 28, 2018, all of which are hereby expressly incorporated by reference into the present application.

TECHNICAL FIELD

The embodiment relates to a semiconductor device package and a light irradiation device including the same.

BACKGROUND ART

An exposure device is a device that transfers a desired pattern to a photosensitive film by placing a mask formed with a desired pattern on a sample coated with a photo-resist, which is a material that reacts to light, and irradiating it with ultraviolet rays.

For example, semiconductor devices, printed circuit boards (PCBs), and display panels that are embedded as main parts of electronic devices may form fine circuit patterns using a photolithography technique in an exposure process.

As a light source of such an ultraviolet exposure apparatus, a mercury ultraviolet lamp, a halogen lamp, or the like may be used, and these lamps have problems of low efficiency and expensive.

Recently, a semiconductor device package is adopted as a light source of an ultraviolet exposure apparatus. A semiconductor device including a compound such as GaN or AlGaN has many advantages such as having wide and easily adjustable band gap energy, and thus may be used in various ways as a light emitting device, a light receiving device, and various diodes.

A semiconductor device package for a light irradiation device such as an exposure device or a curing device needs to form an optical effective area (or fill factor) as large as possible in order to maximize the irradiated energy. However, conventional rectangular semiconductor device packages have limitations in their optical effective area.

In addition, since a plurality of semiconductor device packages are densely arranged for light uniformity, the size of the package is relatively small. Therefore, the area of the electrode is also small, and thus the area in which the protective device is to be disposed is limited. In addition, there is a problem that the electrical connection of the protective device becomes unstable.

DISCLOSURE

Technical Problem

The embodiment provides a semiconductor device package having a large optical effective area.

The embodiment provides a semiconductor device package in which a mounting area of a protective device and an area of a wire bonding are secured.

The problem to be solved in the embodiment is not limited thereto, and the purpose or effect that may be grasped from the solution or embodiment of the problem described below will be also included.

Technical Solution

According to an aspect of the present invention, a semiconductor device package may include a substrate; an electrode disposed on the substrate; a semiconductor device and a protective device which are disposed on the electrode; a dummy electrode disposed on the substrate and disposed to be spaced apart from the electrode along the edge of the substrate; a reflective member disposed on the dummy electrode and having an outer surface, an inner surface surrounding the semiconductor device and forming a cavity, and a bottom surface facing the substrate; and a light-transmitting member disposed on the reflective member and covering the cavity, wherein the inner surface may include a first surface adjacent to the substrate and a second surface extending from the first surface toward the light-transmitting member and having a parabolic shape, and wherein the bottom surface of the reflective member may have a first recess disposed on the protective device between the dummy electrode and the inner surface.

The outer surface of the reflective member may have a horizontal cross section including a hexagonal shape.

The substrate may have a horizontal cross section including a hexagonal shape.

The light-transmitting member may include a plate unit disposed on the reflective member; a first lens unit disposed on the plate unit; a second lens unit disposed on the lower portion of the plate unit, wherein the plate unit may include a first stepped portion on which the reflective member is disposed, and the maximum diameter of the first lens unit and second lens unit may be smaller than the maximum diameter of the cavity.

The electrode may include a first electrode disposed on the substrate and on which the semiconductor device and the protective device are disposed; and a second electrode disposed on the substrate, wherein the second electrode may include a first wire electrically connecting the semiconductor device to the second electrode; and a second wire electrically connecting the protective device to the second electrode, and wherein the second electrode may be disposed to be spaced apart from the first electrode in a first direction parallel to the top surface of the substrate, the second electrode may be overlapped with the semiconductor device in the first direction, the protective device may be disposed to deviate from the semiconductor device in a second direction perpendicular to the first direction, and the first electrode may include a groove disposed between the semiconductor device and the protective device.

The first electrode and the second electrode may be overlapped with the first recess in a vertical direction, and the side surface of the first recess may be disposed to be spaced apart from the first electrode and the second electrode.

The top surface of the first recess may include a sub-recess disposed on the protective device and the second wire, and the height from the top surface of the substrate to the top surface of the sub recess may be greater than the height from the top surface of the substrate to the top surface of the first recess.

The semiconductor device package may further include a first pad and a second pad disposed on the lower portion of the substrate, a first through electrode passing through the substrate and connecting the first electrode and the first pad, and a second through electrode passing through the substrate and connecting the second electrode and the second pad, wherein the first pad and the second pad may be symmetrically disposed with respect to a center line of the reflective member in the second direction, the bottom surface of the reflective member may include a second recess disposed to face the first recess, and the first electrode, the first through electrode, and the first pad may be overlapped with the second recess in a vertical direction.

The bottom surface of the reflective member may include a protrusion disposed inside the dummy electrode and fixed by the dummy electrode.

According to another aspect of the present invention, a light irradiation device may include a circuit substrate; and a plurality of semiconductor device packages disposed on the circuit substrate, wherein the semiconductor device package may include: a substrate; an electrode disposed on the substrate; a semiconductor device and a protective device which are disposed on the electrode; a dummy electrode disposed on the substrate and disposed to be spaced apart from the electrode along the edge of the substrate; a reflective member disposed on the dummy electrode and having an outer surface, an inner surface surrounding the semiconductor device and forming a cavity, and a bottom surface facing the substrate; and a light-transmitting member disposed on the reflective member and covering the cavity, wherein the inner surface may include a first surface adjacent to the substrate and a second surface extending from the first surface toward the light-transmitting member and having a parabolic shape, and the bottom surface of the reflective member may have a first recess disposed on the protective device between the dummy electrode and the inner surface.

Advantageous Effects

According to an embodiment, an optically effective area may be formed in a light irradiation device in which pluralities of semiconductor device packages are densely arranged.

In addition, it is possible to secure the mounting area and wire bonding area of the protective device in the semiconductor device package.

Various and beneficial advantages and effects of the present invention are not limited to the above description, and will be more easily understood in the course of describing specific embodiments of the present invention.

BEST MODE

Hereinafter, the preferred embodiments of the present invention will be described in detail with reference to the accompanying drawings.

However, the technical idea of the present invention is not limited to some embodiments to be described, but may be implemented in a variety of different forms, and one or more of the components among the embodiments may be selectively combined and substituted within the scope of the technical idea of the present invention.

In addition, the terms (including technical and scientific terms) used in the embodiments of the present invention may be interpreted as a meaning that may be generally understood by those of ordinary skill in the art, unless explicitly defined and described, and the commonly used terms such as terms defined in a dictionary may be interpreted in consideration of the meaning in the context of the related technology.

In addition, the terms used in the embodiments of the present invention are for describing the embodiments and are not intended to limit the present invention.

In this specification, the singular form may also include the plural form unless specifically stated in the phrase, and when described as "at least one (or more than one) of A, B and C", it may include one or more of all combinations that may be combined with A, B, and C.

In addition, in describing the components of an embodiment of the present invention, the terms such as first, second, A, B, (a), and (b) may be used.

These terms are only for distinguishing the component from other components, and are not limited to the nature, order, or sequence of the component by the term.

And, when a component is described as being 'coupled' or 'connected' to another component, the component is not only directly coupled or connected to the other component, but also the component may also include the case of being 'coupled' or 'connected' due to another component between the other components.

In addition, when it is described as being formed or disposed on the "top (upper) or bottom (lower)" of each component, the top (upper) or bottom (lower) is not only when the two components are in direct contact with each other, but also it may include a case in which one or more other components may be formed or disposed between the two components. In addition, when expressed as "top (upper) or bottom (lower)", the meaning of not only an upward direction but also a downward direction based on one component may be included.

Figure 1:
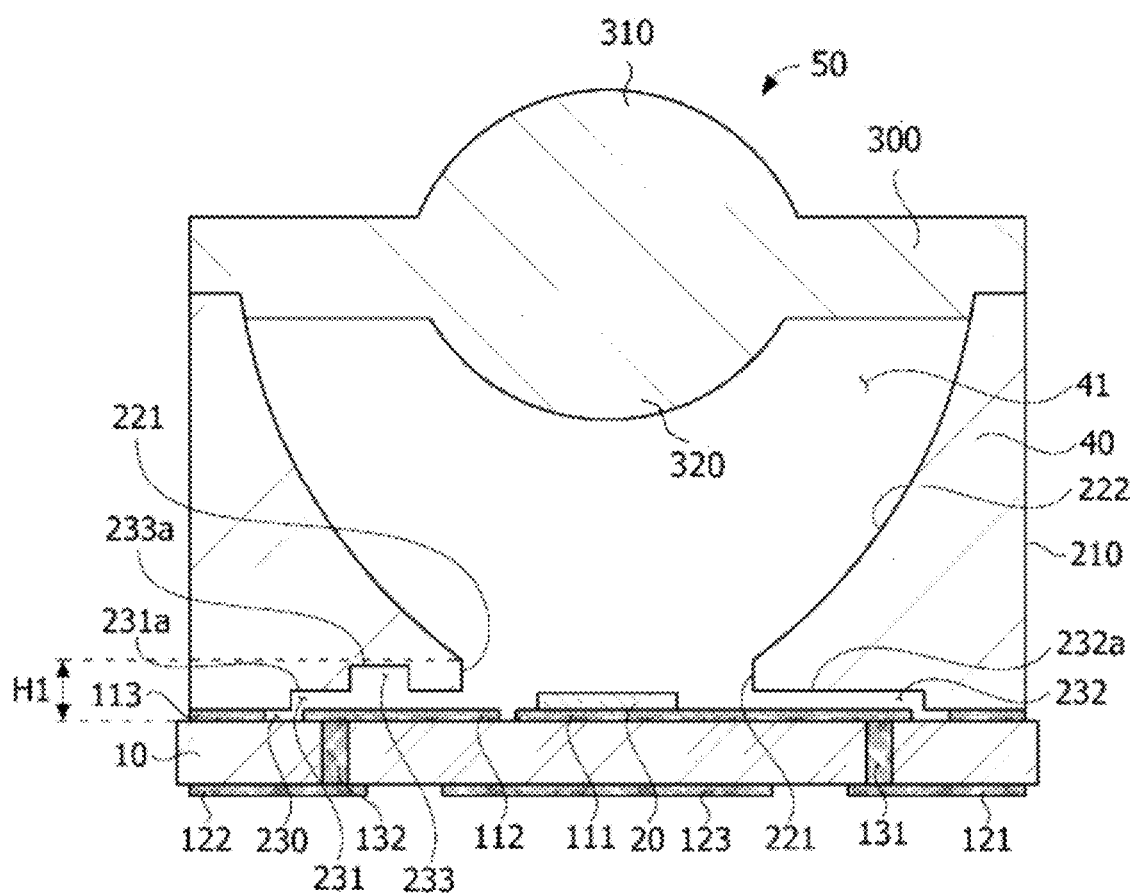
FIG. 1 is a cross-sectional view showing a semiconductor device package according to an embodiment of the present invention.
Figure 2:
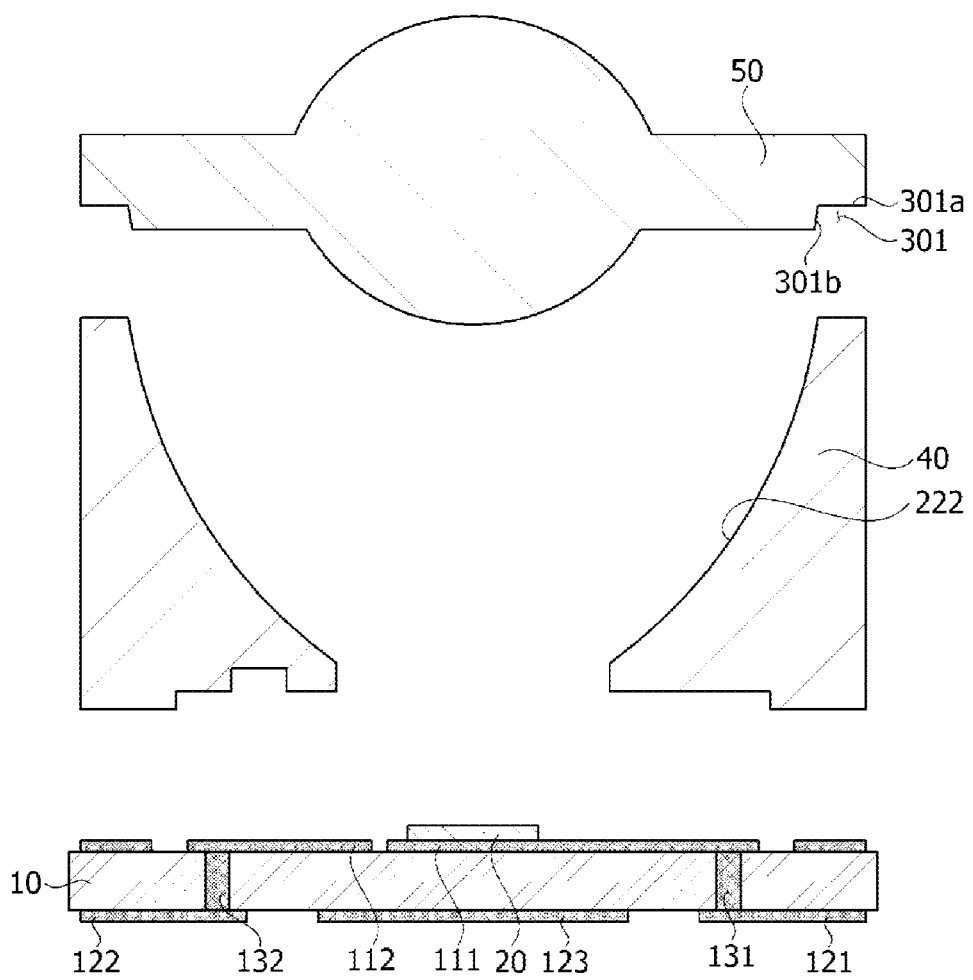
FIG. 2 is an exploded cross-sectional view of FIG. 1.

FIG. 1 is a cross-sectional view showing a semiconductor device package according to an embodiment of the present invention, and FIG. 2 is an exploded cross-sectional view of FIG. 1.

Referring to FIGS. 1 and 2, a semiconductor device package according to an embodiment of the present invention may include a substrate 10, a semiconductor device 20, a reflective member 40, and a light-transmitting member 50, wherein an inner surface 220 of the reflective member 40 may include a first surface 221 and a second surface 222 extending from the first surface 221 toward the light-transmitting member 50.

The substrate 10 may be made of an insulating material. For example, the substrate 10 may include ceramics such as AlN and aluminum oxide ($Al_2O_3$). In order to further improve heat dissipation characteristics, the substrate 10 including AlN may be used, but is not limited thereto.

The substrate 10 may consist of only a single layer. This is because when the substrate 10 consists of a plurality of layers, alignment tolerance may occur in the process of stacking the plurality of layers. In this case, it is not possible to embed a protective device or the like in the substrate 10. However, the present invention is not limited thereto, and the substrate 10 may include a plurality of layers.

A first electrode 111 and a second electrode 112 may be disposed on the top surface of the substrate 10. The first electrode 111 and the second electrode 112 may include at least one of Ti, Ru, Rh, Ir, Mg, W, Zn, Al, In, Ta, Pd, Co, Ni, Si, Ge, Ag, and Au. For example, the first electrode 111 and the second electrode 112 may have a structure in which W/Ti/Ni/Cu/Pd/Au are stacked in order.

A dummy electrode 113 may be disposed on the top surface of the substrate 10. The dummy electrode 113 may be disposed to be spaced apart from the first electrode 111 and the second electrode 112 along the edge of the substrate 10. The dummy electrode 113 may be electrically insulated from the first electrode 111 and the second electrode 112. The dummy electrode 113 may have the same composition as the first electrode 111 and the second electrode 112. For example, the first electrode 111, the second electrode 112, and the dummy electrode 113 may be fabricated by forming an electrode layer on the substrate 10 and then patterning.

The thickness of the dummy electrode 113 may be the same as the thickness of the first electrode 111 and the second electrode 112. However, the thickness of the dummy electrode 113 is not necessarily limited thereto, and the thickness of the dummy electrode 113 may be thicker than the thickness of the first electrode 111 and the second electrode 112.

A first pad 121, a second pad 122, and a third pad 123 may be disposed on the lower portion of the substrate 10. The third pad 123 may be disposed between the first pad 121 and the second pad 122. The first pad 121 may be connected to the first electrode 111 through a first through electrode 131, and the second pad 122 may be connected to the second electrode 112 through a second through electrode 132. The first through electrode 131 and the second through electrode 132 may penetrate the substrate 10 in the vertical direction.

The semiconductor device 20 may be disposed on the first electrode 111 and may be electrically connected to the second electrode 112 through a wire.

However, the present invention is not necessarily limited thereto, and the semiconductor device 20 may be electrically connected to the first electrode 111 and the second electrode 112 through the wire. In addition, the semiconductor device 20 may be implemented as a flip chip. In this case, the semiconductor device 20 may be disposed on the first electrode 111 and the second electrode 112, or disposed on a sub-mount (not shown), such that the first electrode 111 and the second electrode 112 may be electrically connected to each other.

The semiconductor device 20 may output light in an ultraviolet wavelength band. For example, the semiconductor device 20 may output light in a near-ultraviolet wavelength band (UV-A), may output light in a far-ultraviolet wavelength band (UV-B), and light in a deep ultraviolet wavelength band (UV-C). However, the present invention is not limited thereto, and the semiconductor device 20 may be manufactured to output light in a wavelength band required for exposure. The wavelength range may be determined by the composition ratio of Al in the semiconductor structure.

The reflective member 40 may be disposed on the dummy electrode 113. The reflective member 40 may include an outer surface 210, an inner surface 220 and a bottom surface 230.

The inner surface 220 may surround the semiconductor device 20 and constitute a cavity 41. The cavity 41 may penetrate the reflective member 40 in the vertical direction to expose at least a portion of the top surface of the substrate 10.

The cavity 41 may include an air gap. The air gap may mean a space filled with air, and one air gap may be formed over the entire area of the cavity 41.

However, the present invention is not necessarily limited thereto, and various gases other than air (e.g., nitrogen) may be filled in the cavity 41, and a polymer resin or the like may be filled.

The inner surface 220 may include a first surface 221 adjacent to the substrate 10 and a second surface 222 extending from the first surface 221 toward the light-transmitting member 50.

The first surface 221 may be perpendicular to the top surface of the substrate 10. However, the present invention is not limited thereto, and the first surface 221 may have an inclination of 89 to 91 degrees with respect to the top surface of the substrate 10. The height H1 from the top surface of the substrate 10 to the upper end of the first surface 221 may be 280 μm to 320 μm, and for example, may be 300 μm. When the height H1 is 280 μm or more, it is possible to improve cracking during fabrication of the reflective member 40, and when the height H1 is 320 μm or less, the problem of increasing the size of the package may be improved.

The second surface 222 may have a shape whose width increases as the distance from the substrate 10 increases. In addition, the second surface 222 may have a curvature. For example, the second surface 222 may have a parabolic shape. In this case, light emitted from the semiconductor device 20 may be reflected upwardly from the second surface 222. In addition, a velocity of light may be increased and a uniform light distribution may be obtained. However, the present invention is not necessarily limited thereto.

The bottom surface 230 may be disposed to face the top surface of the substrate 10. The bottom surface 230 may include a first recess 231 and may further include a second recess 232. The height from the top surface of the substrate 10 to the top surface 231*a* of the first recess 231 may be greater than the height from the top surface of the substrate 10 to the bottom surface 230 of the reflective member 40. The height from the top surface of the substrate 10 to the top surface 232*a* of the second recess 232 may be greater than the height from the top surface of the substrate 10 to the bottom surface 230 of the reflective member 40. The height from the top surface of the substrate 10 to the top surface 231*a* of the first recess 231 may be the same as or different from the height from the top surface of the substrate 10 to the top surface 232*a* of the second recess 232.

The first recess 231 may be connected to the first surface 221. However, the present invention is not necessarily limited thereto, and the first recess 231 may be disposed to be spaced apart from the outside of the first surface 221. For example, when the thickness of the dummy electrode 113 is sufficiently larger than the thickness of the first electrode 111 and the second electrode 112, the first recess 231 may be formed only at the position of the sub recess 233 to be described later.

The first recess 231 and the second recess 232 may be disposed to face each other with the semiconductor device 20 interposed therebetween. In this case, the first recess 231 and the second recess 232 may be connected to the first surface 221.

The top surface 231a of the first recess 231 may include a sub recess 233. The height from the top surface of the substrate 10 to the top surface 233a of the sub recess 233 may be greater than the height from the top surface of the substrate 10 to the top surface 231a of the first recess 231.

The reflective member 40 may be made of various materials capable of reflecting ultraviolet light. For example, when the reflective member 40 includes aluminum (Al), it may exhibit high reflectivity in an ultraviolet wavelength band. However, the present invention is not limited thereto, and a reflective layer (not shown) including a material capable of reflecting ultraviolet light, for example, aluminum (Al), may be disposed on the inner surface 220 of the reflective member 40.

The reflective member 40 may be attached on the dummy electrode 113. In addition, the substrate 10 may contain an insulating material while the dummy electrode 113 may contain a conductive material. Thus, when the reflective member 40 is attached to the dummy electrode 113 rather than the case where it is attached to the substrate 10, the adhesion may be improved. An adhesive layer (not shown) may be disposed between the reflective member 40 and the dummy electrode 113. The adhesive layer may include solder, but is not necessarily limited thereto, and may also include an epoxy or silicon-based adhesive material.

However, the present invention is not limited thereto, and a reflective layer (not shown) may be disposed on the inner surface 220.

The light-transmitting member 50 may be disposed on the reflective member 40 to cover the cavity 41. The light-transmitting member 50 may include a plate unit 300 and a first lens unit 310, and may further include a second lens unit 320.

The plate unit 300 may be disposed on the reflective member 40. The plate unit 300 may be disposed so that the top surface and the bottom surface are parallel. The plate unit 300 may include a first stepped portion 301 disposed at a lower corner portion where the side surface and the bottom surface meet.

A reflective member 40 may be disposed in the first stepped portion 301. That is, the top surface 301a of the stepped portion 301 may be disposed on the reflective member 40, and the side surface 301b of the stepped portion 310 may be disposed to face the inner surface 220 of the reflective member 40. The side surface 301b of the stepped portion 310 may be a vertical surface or an inclined surface. The inner surface 220 of the reflective member 40 may be extended from the second surface 222 toward the light-transmitting member 50 and may include a third surface (not shown) having the same slope as that of the side surface 301b of the stepped portion 310, but is not necessarily limited thereto.

An adhesive layer (not shown) may be disposed between the top surface 301a of the stepped portion 310 and the reflective member 40. The adhesive layer may include a UV curable resin, but is not limited thereto.

The first lens unit 310 may be disposed on the plate unit 300, and the second lens unit 320 may be disposed on the lower portion of the plate unit 300.

The maximum diameter of the first lens unit 310 may be smaller than the maximum diameter of the cavity 41. Therefore, the light irradiated upward from the semiconductor device 20 is condensed by the first lens unit 310, while the light reflected upward from the second surface 222 may be irradiated upward by passing through the plate unit 300 from the outside of the first lens unit 310.

The maximum diameter of the second lens unit 320 may be smaller than the maximum diameter of the cavity 41. Due to the second lens unit 320, the thickness of the reflective member 40 in the vertical direction may be reduced, thereby improving a problem in which the package size is increased.

The light-transmitting member 50 is not particularly limited as long as it is a material capable of transmitting light in the ultraviolet wavelength band. For example, the light-transmitting member 50 may include an optical material having high UV wavelength transmittance, such as quartz or glass, but is not limited thereto.

Figure 3:
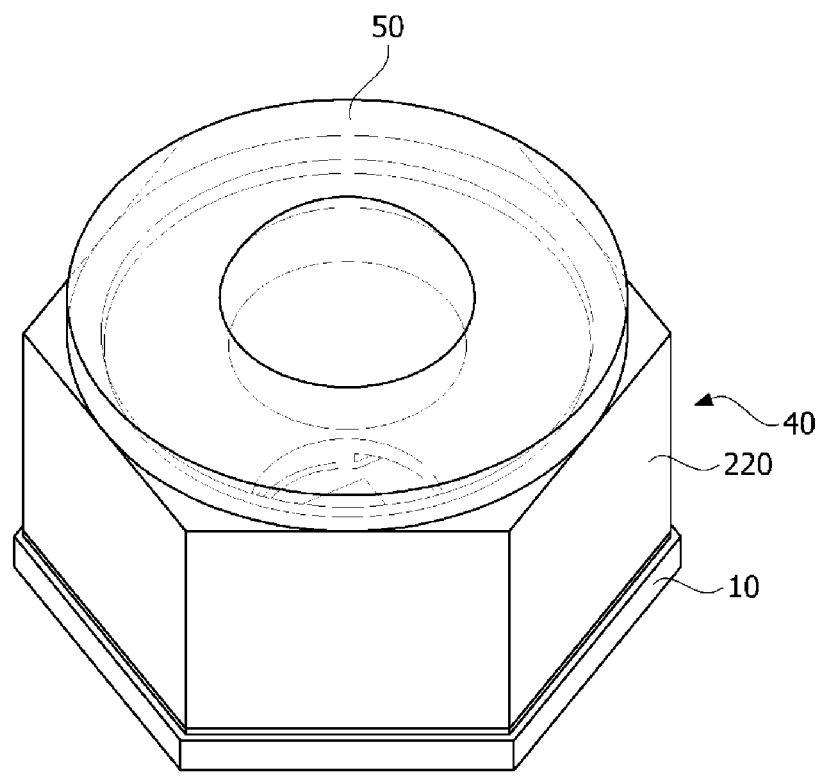
FIG. 3 is a perspective view of FIG. 1.

FIG. 3 is a perspective view of FIG. 1.

Referring to FIG. 3, the reflective member 40 may have a hexagonal column shape. Thus, the outer surface 220 of the reflective member 40 may have a horizontal cross section including a hexagonal shape. The horizontal cross section may mean a cross section cut parallel to the top surface of the substrate 10. In particular, in order to maximize the optical effective area of the package and to arrange a plurality of packages as densely as possible, it is preferable that the outer surface 220 of the reflective member 40 has the horizontal cross section of a regular hexagonal shape.

Figure 4:
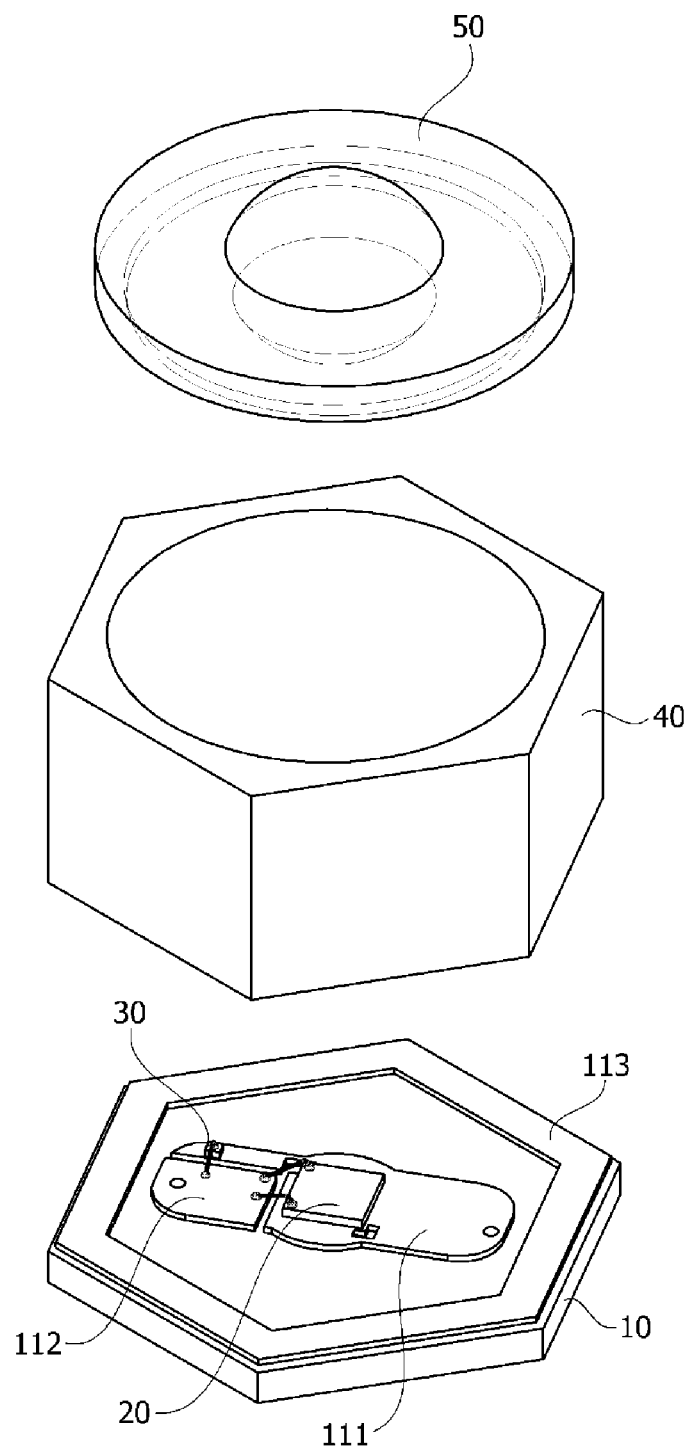
FIG. 4 is an exploded perspective view of FIG. 3.

FIG. 4 is an exploded perspective view of FIG. 3;

Referring to FIG. 4, the horizontal cross section of the substrate 10 may include a hexagonal shape, preferably a regular hexagonal shape.

The semiconductor device 20 and the protective device 30 may be disposed on the first electrode 10. The protective device 30 may include a Zener diode, but is not limited thereto, and may include another protective device capable of protecting the semiconductor device 20 from instantaneous high voltage such as static electricity.

The dummy electrode 113 may be disposed along the edge of the substrate 10. The dummy electrode 113 may be disposed to be spaced apart from the first electrode 111 and the second electrode 112 to be electrically insulated.

Figure 5:
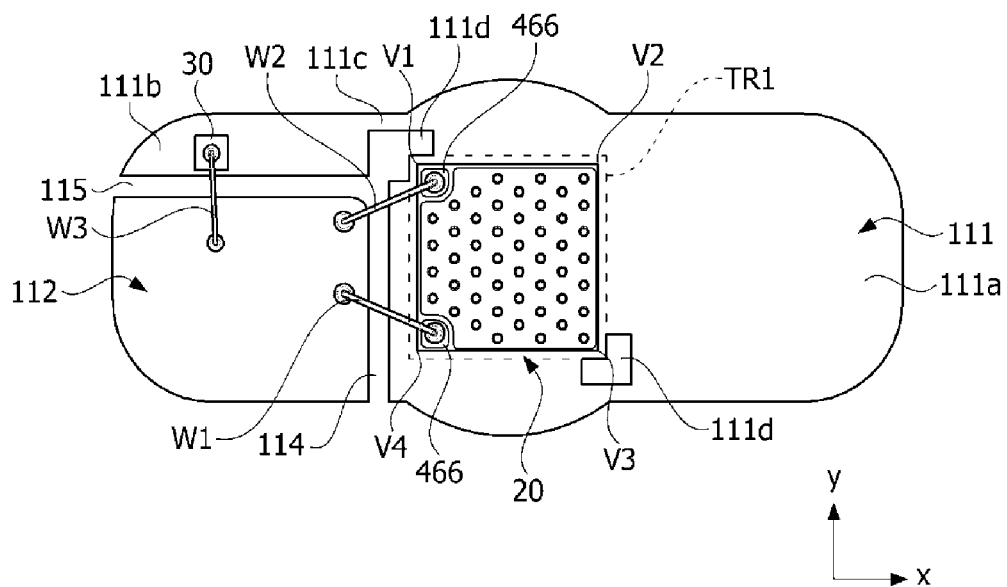
FIG. 5 is a diagram showing an electrode arrangement.
Figure 6:
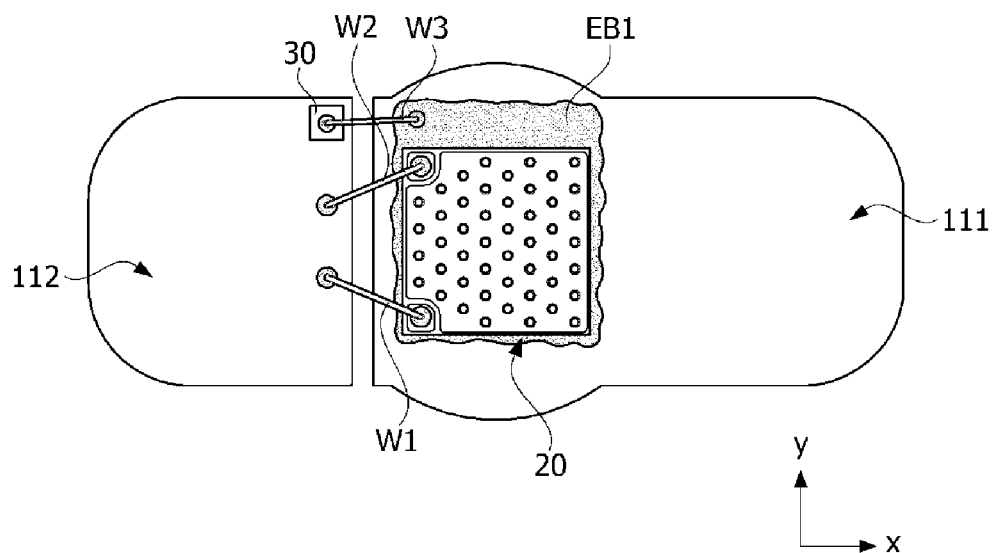
FIG. 6 is a view for explaining a problem that it is difficult to mount a protective device during a Eutectic bonding of a semiconductor device.

FIG. 5 is a diagram showing an electrode arrangement, and FIG. 6 is a view for explaining a problem that it is difficult to mount a protective device during a Eutectic bonding of a semiconductor device.

Referring to FIG. 5, the first electrode 111 may include a first sub-region 111a in which the semiconductor device 20 is disposed and a second sub-region 111b in which the protective device 30 is disposed. In addition, it may include an extension part 111c connecting the first sub-region 111a and the second sub-region 111b.

The first sub-region 111a may include a plurality of grooves 111d disposed in a diagonal direction.

The plurality of grooves 111d may be grooves for alignment capable of recognizing an area in which the semiconductor device 20 is disposed. The top surface of the substrate 10 may be exposed by the plurality of grooves 111d. That is, the plurality of grooves 111d may be holes exposing the top surface of the substrate 100.

The plurality of grooves 111d may include a first groove 111d facing a first corner V1 of the semiconductor device 20 and a second groove 111d facing a third corner V3 of the semiconductor device 200. However, it is not limited thereto, and may further include a groove 111d facing second and fourth corners V2 and V4 of the semiconductor device 20.

The semiconductor device 20 may be disposed in a rectangular area TR1 having a maximum size that is surrounded by the first groove 111d and the second groove 111d. For example, when the semiconductor device 20 is of a vertical type, the P-type electrode pad 466 may be electrically connected to the second electrode 112 by the first wires W1 and W2. In this case, although it is illustrated that there are two P-type electrode pads 466, it is not necessarily limited thereto.

The semiconductor device 20 may be electrically connected to the first electrode 111 by a metal layer. Specifically, an alloy layer may be disposed between the conductive substrate of the semiconductor device 20 and the first electrode 111. The alloy layer may include at least one of Au, In, Cu, Sn, and Ni. For example, the alloy layer may include a Eutectic metal such as Au—In, Cu—Sn, In—Sn, Au—Cu, Au—Sn, and Ni—Sn. A Eutectic bonding has the advantage of excellent heat dissipation. However, the electrical connection method is not necessarily limited thereto, and various methods of electrically connecting semiconductor devices such as solder paste may be included. Hereinafter, the Eutectic bonding will be described as an example.

In the Eutectic bonding, after the Eutectic metal is applied to the rectangular area TR1, the semiconductor device 20 may be disposed thereon. However, since the Eutectic metal has good fluidity, there is a problem that the Eutectic metal flows to the outside of the rectangular area TR1.

As shown in FIG. 6, the eutectic metal EB1 may flow to cover the wire bonding area of the protective device 30. In this case, there may be a problem in that the second wire W3 is not properly bonded by the eutectic metal EB1.

In general, since a plurality of semiconductor device packages for exposure are densely arranged and light needs to be uniformly irradiated to the target, it may be important to reduce the size of the package. Therefore, the electrode area in the package may also be reduced.

Since the electrode area of the semiconductor device package for exposure is small, it is difficult to secure an area for mounting the protective device 30 when the eutectic metal flows outward of the semiconductor device 20.

Referring again to FIG. 5, the protective device 30 may be disposed in the second sub-region 111b, and may be electrically connected to the second electrode 112 through a second wire W3.

Since the protective device 30 may be disposed to be overlapped with the second electrode 112 in the second direction (Y-axis direction), it may be disposed to be deviated from the semiconductor device 20 in the second direction (Y-axis direction). Therefore, even if the eutectic metal flows to the outside of the semiconductor device 20, the mounting area of the protective device 30 may be secured. In addition, the end of the second wire W3 connected to the second electrode 112 may be disposed farther away from the semiconductor device 20 in the first direction (X-axis direction) than the ends of the first wires W1 and W2.

The first groove 111d may be disposed between the semiconductor device 20 and the protective device 30 to prevent the eutectic metal from flowing to the second sub-region 111b. Accordingly, the eutectic metal may be blocked from flowing to the area where the protective device 30 is disposed by the first groove 111d. Specifically, the first groove 111d may be disposed between the first corner V1 of the semiconductor device 20 and the protective device 30.

The first groove 111d may serve as a dam for indicating a mounting area of the semiconductor device 20 and at the same time preventing the eutectic metal from flowing to the mounting area of the protective device 30.

The groove 111d may have a cramp shape such as "]", but is not limited thereto. For example, the groove 111d may have a rod shape or an arc shape. Alternatively, it may be disposed in the first electrode 111 in the form of an opening to expose the top surface of the substrate. That is, the shape of the groove 111d is not particularly limited as long as it may play a role of preventing the eutectic metal from flowing to the mounting area of the protective device 30 while indicating the position where the semiconductor device 20 is mounted.

The first sub-region 11a may be a region overlapped with the second electrode 112 in the first direction (X-axis direction). Also, the second sub-region 111b may be a region overlapped with the second electrode 112 in the second direction (Y-axis direction). That is, the second sub-region 111b may protrude from the first sub-region 111a in the first direction (X-axis direction).

A first spacing region 114 may be formed between the second electrode 112 and the first sub-region 111a, and a second spacing region 115 may be formed between the second electrode 112 and the second sub-region 111b. That is, the second electrode 112 may be disposed to be spaced apart from the first electrode 111 in a first direction (X-axis direction) and a second direction (Y-axis direction). In this case, the first groove 111d may be connected to the first spacing region 114 and the second spacing region 115. That is, the first groove 111d may be disposed between the semiconductor device 20 and the protective device 30 by being disposed diagonally to the second electrode 112.

The area of the semiconductor device 20 may be 30% to 50% of the area of the first electrode 111. When the area of the semiconductor device 20 is less than 30%, since the size of the semiconductor device 20 is reduced, there is a problem that light output is weakened. In addition, when the area of the semiconductor device 20 is larger than 50%, there is a problem that it is difficult to secure a space to mount the protective device 30.

Figure 7:
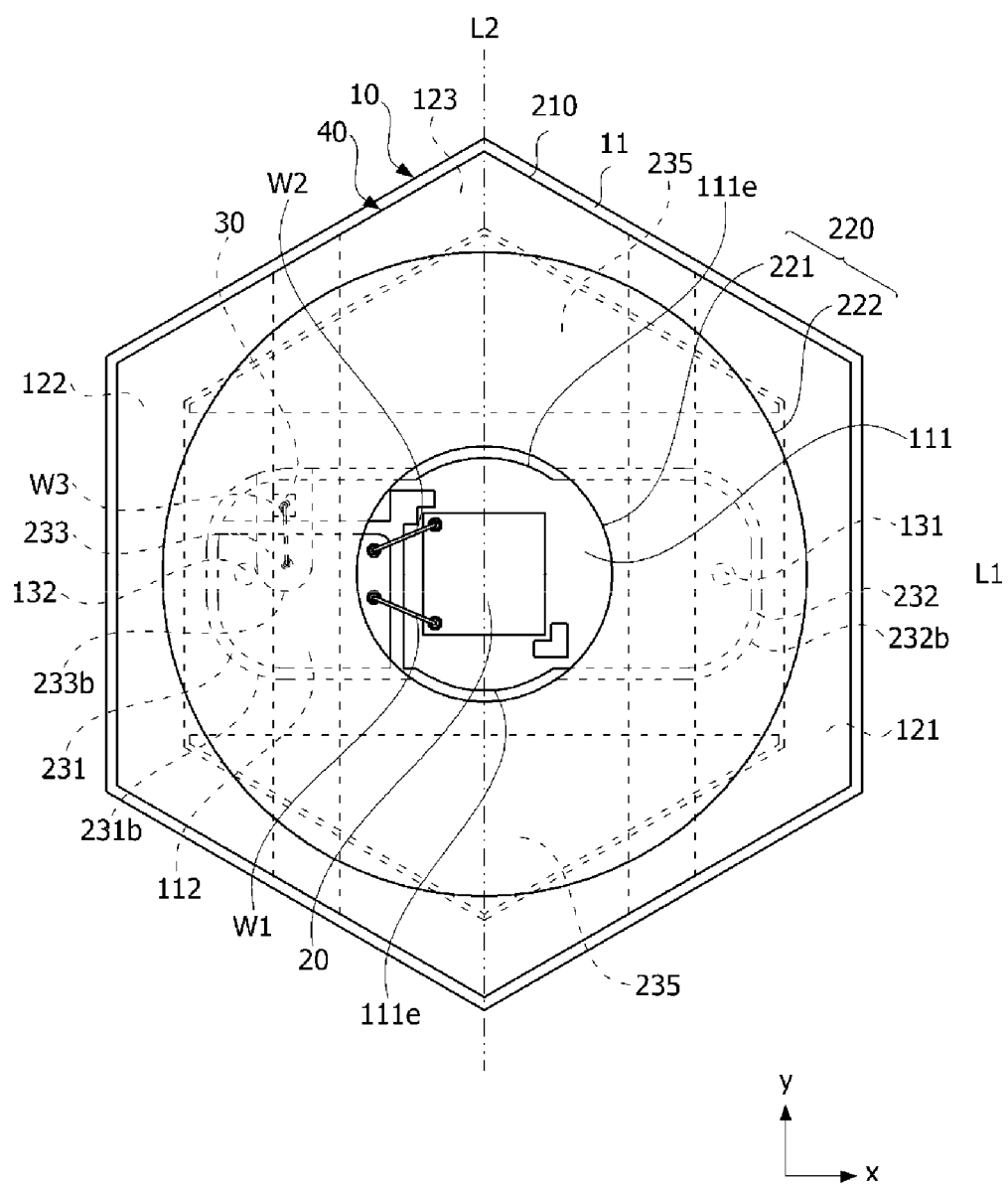
FIG. 7 is a view showing a semiconductor device package superposed in a vertical direction according to an embodiment of the present invention.

FIG. 7 is a view showing a semiconductor device package according to an embodiment of the present invention superposed in a vertical direction.

Referring to FIG. 7, the protective device 30 may be disposed outside the first surface 221. Specifically, the protective device 30 may be disposed between the outer surface 210 and the first surface 221 of the reflective member 40.

The first electrode 111 and the second electrode 112 may be overlapped with the first recess 231 in the vertical direction. Accordingly, an area in which the protective device 30 disposed inside the side surface 231b of the first recess 231 may be electrically connected may be secured. In this case, the first recess 231 and the sub-recess 233 are disposed on the protective device 30 and the second wire W3, a space for the protective device 30 and the second wire W3 may be provided between the top surface of the substrate 10 and the bottom surface of the reflective member 40. That is, the protective device 30 and the second wire W3 may be disposed to be spaced apart from the top surface and the side surface 231b of the first recess 231 and may be disposed to be spaced apart from the top surface and the side surface 233b of the sub recess 233.

The side surface 231b of the first recess 231 may be disposed to be spaced apart from the first electrode 111 and the second electrode 112. Thus, the reflective member 40 may be electrically insulated. The side surface 233b of the sub-recess 233 may be connected to the side surface 231b of the first recess 231. That is, the sub-recess 233 may be extended from the side surface 231b of the first recess 231 in the second direction (Y-axis direction).

The second electrode 112, the second through electrode 132, and the second pad 122 may be overlapped with the first recess 231 in the vertical direction. That is, the second through electrode 132 may be disposed inside the side surface 231b of the first recess 231. Accordingly, when all or most of the regions of the second electrode 112 are disposed to be overlapped with the first recess 231 in the vertical direction, a region to which the second through electrode 132 may be connected may be sufficiently secured. Also, since the area of the third pad 123 is increased, the heat dissipation performance may be improved.

The ends of the first wire W1 and W2 disposed on the second electrode 112 may be disposed inside the first surface 221. That is, a part of the second electrode 112 may be extended into the first surface 221. Therefore, there is an advantage that it is not necessary to process additional sub-recesses to secure a space for the first wire W1 and W2.

The inner surface 220 of the reflective member 40 may form rotation symmetry around a point where the center line L1 in the first direction (X-axis direction) and the center line L2 in the second direction (Y-axis direction) of the reflective member 40 intersect. That is, the horizontal cross section of the cavity may include a circular shape. In addition, the semiconductor device 20 may be disposed at a point where the center line L1 in the first direction (X-axis direction) and the center line L2 in the second direction (Y-axis direction) of the reflective member 40 intersect. Therefore, even if the package is rotated, the optical properties may be uniformly maintained. Meanwhile, since the protective device 30 is disposed outside the first surface 221 and is not exposed through the cavity, even if the position of the protective device 30 is changed according to the rotation angle of the package, a problem in which the optical properties of all packages is changed may be improved.

The first pad 121 and the second pad 122 may have a symmetrical shape and arrangement with respect to the center line L2 in the second direction (Y-axis direction) of the reflective member 40. Accordingly, it is possible to improve a problem in which solder is concentrated when the package is mounted. In particular, when pluralities of packages are mounted by rotating them at different angles, it may be a very important problem in order to make the optical properties of the plurality of packages identical to each other.

The first electrode 111, the first through electrode 131 and the first pad 121 may be overlapped with the second recess 232 in the vertical direction. That is, the first through electrode 131 may be disposed inside the side surface 232b of the second recess 232. Therefore, the first pad 121 and the second pad 122 have a symmetrical shape and arrangement with respect to the center line L2 in the second direction (Y-axis direction) of the reflective member 40, and thus, even when the first pad 121 is not overlapped with the inner region of the first surface 221 in the vertical direction, it may be electrically connected to the first electrode 111 through the first through electrode 131.

The first electrode 111 may include a pair of curved portions 111e. The curved portions 111e may be disposed to be spaced apart from the inside of the first surface 221. The pair of curved portions 111e may have the same spacing distance from the first surface 221. That is, the pair of curved portions 111e may have a symmetrical shape and arrangement with respect to the center line L1 in the first direction (X-axis direction). The curved portions 111e may be for checking alignment between the substrate 10 and the reflective member 40. The curved portions 111e may be a part of a concentric circle of the first surface 221, but is not limited thereto.

The first recess 231 and the second recess 232 may be formed to be spaced apart from each other along the first surface 221, but are not limited thereto and may be integrally formed. That is, one recess may be disposed along the first surface 221.

The substrate 10 may include an edge portion 11 protruding outward of the reflective member 40. Accordingly, the problems such as cracking of the reflective member 40 during the package dicing process may be improved.

Among the plurality of side surfaces of the semiconductor device 20, two side surfaces facing the first recess 231 and the second recess 232, that is, two side surfaces extending in the Y-axis direction may be disposed parallel to the side of the substrate 10 facing them and the outer surface 210 of the reflective member 40. Among the plurality of side surfaces of the semiconductor device 20, two side surfaces facing the curved portions 111e, that is, two side surfaces extending in the X-axis direction may be disposed to be inclined without being parallel to the side surface of the substrate 10 facing them and the outer surface 210 of the reflective member 40.

Figure 8:
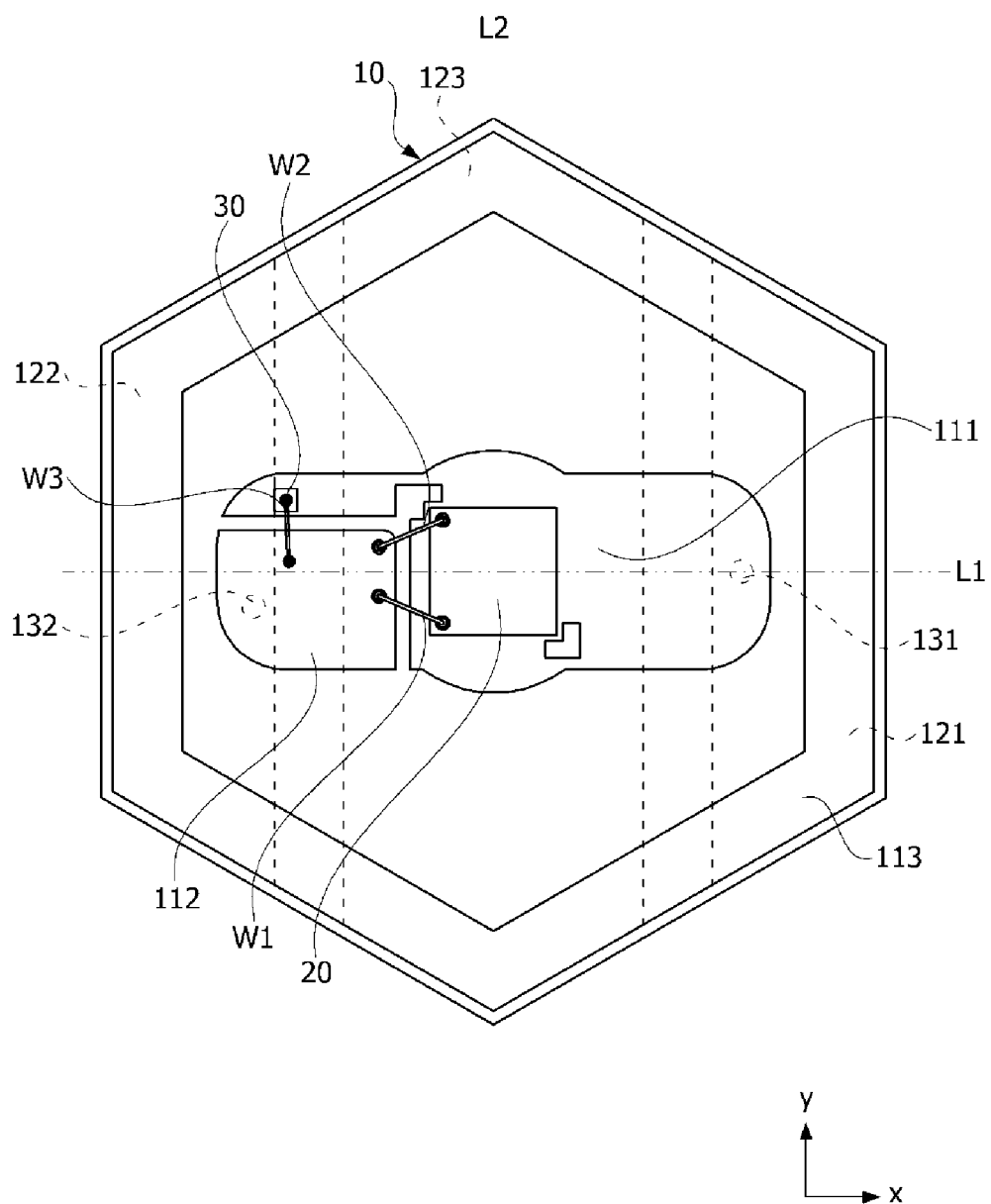
FIG. 8 is a modified example of a through electrode in FIG. 7.

FIG. 8 is a modified example of a through electrode in FIG. 7.

Referring to FIGS. 7 and 8, the first through electrode 131 and the second through electrode 132 may be disposed on the center line L1 in the first direction (X-axis direction) of the reflective member 40 as shown in FIG. 7. For example, the first through electrode 131 and the second through electrode 132 may be disposed symmetrically with respect to the center line L2 in the second direction (Y-axis direction) of the reflective member 40.

However, the present invention is not limited thereto, and the second through electrode 132 may be disposed to be spaced apart from the center line L1 in the first direction (X-axis direction) of the reflective member 40 as shown in FIG. 8.

For example, the second through electrode 132 may be disposed on the opposite side of the protective device 30 with respect to the center line L1 in the first direction (X-axis direction) of the reflective member 40. As a result, the distance in the second direction (Y-axis direction) between the protective device 30 and the second through electrode 132 may be increased. Accordingly, the bonding area of the second wire W3 may be expanded. In addition, it is possible to prevent the end of the second wire W3 disposed on the second electrode 112 from being overlapped with the second through electrode 132 in the vertical direction. In this case, the first through electrode 131 and the second through electrode 132 may be asymmetrically disposed with respect to the center line L2 in the second direction (Y-axis direction) of the reflective member 40, but is not limited thereto. In addition, the first through electrode 131 may also be disposed to be spaced apart from the center line L1 in the first direction (X-axis direction) of the reflective member 40 so as to be disposed symmetrically to each other.

Figure 9:
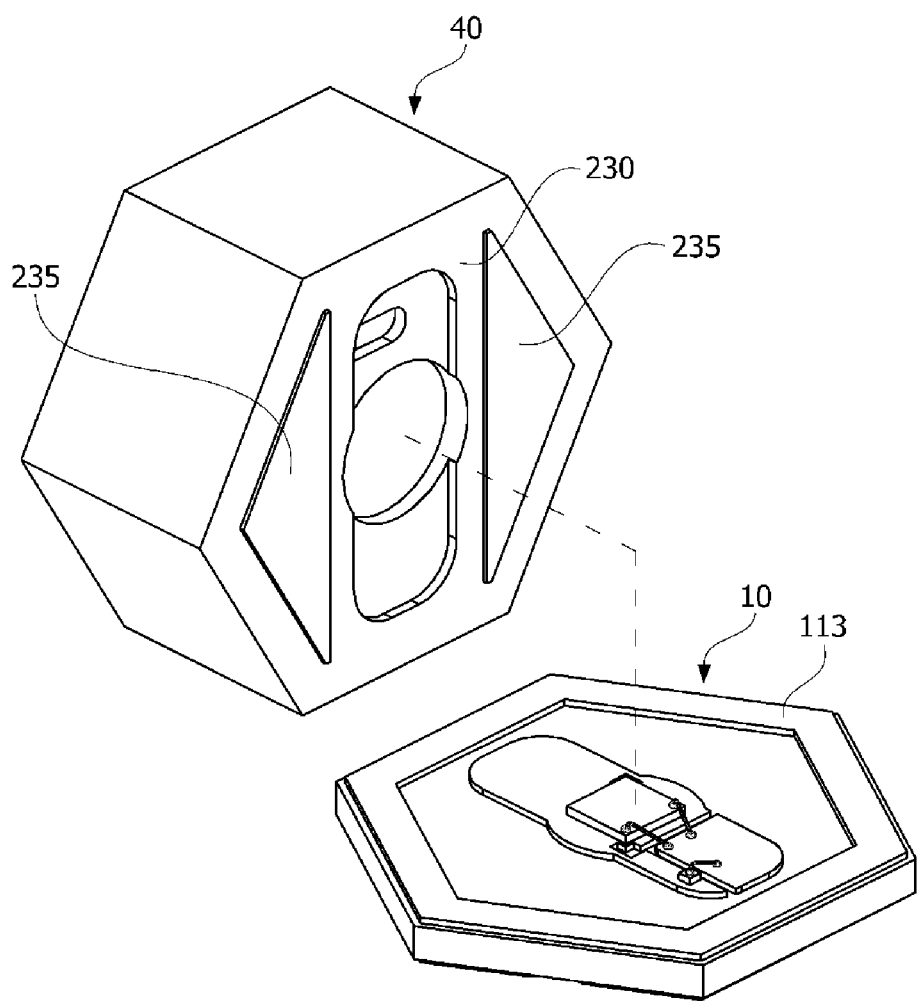
FIG. 9 is a view showing a coupling relationship between a substrate and a reflective member.

FIG. 9 is a view showing a coupling relationship between a substrate and a reflective member.

Referring to FIGS. 7 and 9, the dummy electrode 113 may be disposed on the substrate 10, and a bottom surface 230 of the reflective member 40 may include a protrusion 235. The protrusion 235 may be inserted into the dummy electrode 113. Accordingly, the assembly of the substrate 10 and the reflective member 40 may be facilitated and the alignment may be improved. In addition, it is possible to prevent the reflective member 40 from rotating with respect to the substrate 10 after assembly.

The pair of protrusions 235 may have a symmetrical shape and arrangement with respect to the center line L1 in the first direction (X-axis direction).

The thickness of the dummy electrode 113 may be 80 μm to 100 μm, and may be 90 μm by way of an example. However, it is not necessarily limited thereto, and may exceed 100 μm. The thickness of the protrusion 235 may be 60 μm to 70 μm, but is not limited thereto. The thickness of the dummy electrode 113 may be equal to or thicker than the thickness of the protrusion 235.

Figure 10:
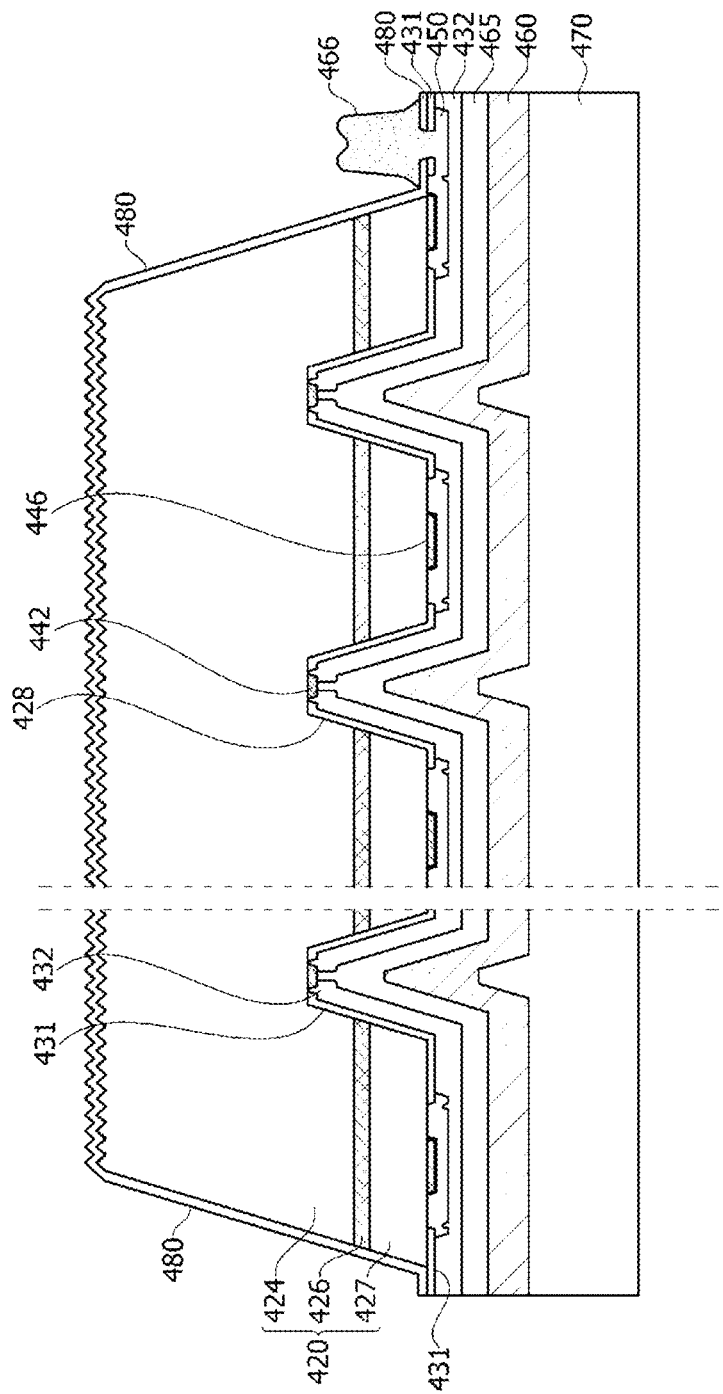
FIG. 10 is a conceptual diagram of the semiconductor device of FIG. 1.

FIG. 10 is a conceptual diagram of the semiconductor device of FIG. 1.

Referring to FIG. 10, the semiconductor device 20 may include a light emitting structure 420, first electrodes 442 and 465 electrically connected to a first conductivity type semiconductor layer 424 of the light emitting structure 420, and second electrodes 446 and 450 electrically connected to a second conductivity type semiconductor layer 427.

The light emitting structure 420 may include a first conductivity type semiconductor layer 424, a second conductivity type semiconductor layer 427, and an active layer 426 disposed between the first conductivity type semiconductor layer 424 and the second conductivity type semiconductor layer 427.

The first conductivity type semiconductor layer 424 may be implemented as a compound semiconductor such as Group III-V or Group II-VI, and may be doped with a first dopant. The first conductivity type semiconductor layer 424 may be selected from the semiconductor materials having a composition formula of $In_{x1}Al_{y1}Ga_{1-x1-y1}N$ ($0 \le x1 \le 1$, $0 \le y1 \le 1$, $0 \le x1+y1 \le 1$), for example, GaN, AlGaN, InGaN, InAlGaN, and the like. In addition, the first dopant may be an n-type dopant such as Si, Ge, Sn, Se, and Te. When the first dopant is an n-type dopant, the first conductivity-type semiconductor layer 424 doped with the first dopant may be an n-type semiconductor layer.

The active layer 426 is disposed between the first conductivity type semiconductor layer 424 and the second conductivity type semiconductor layer 427. The active layer 426 is a layer in which electrons (or holes) injected through the first conductivity type semiconductor layer 424 and holes (or electrons) injected through the second conductivity type semiconductor layer 427 meet. The active layer 426 transitions to a low energy level as the electrons and holes are recombined, and may generate light having an ultraviolet wavelength.

The active layer 426 may have a single well structure, a multiple well structure, a single quantum well structure, a multi quantum well (MQW) structure, a quantum dot structure, or a quantum wire structure, and the structure of the active layer 426 is not limited thereto.

The second conductivity-type semiconductor layer 427 may be formed on the active layer 426 and may be implemented as a compound semiconductor such as Group III-V or Group II-VI. In addition, a second dopant may be doped on the second conductivity type semiconductor layer 427. The second conductivity type semiconductor layer 427 may be formed of a semiconductor material having a composition formula of $In_{x5}Al_{y2}Ga_{1-x5-y2}N$ ($0 \le x5 \le 1$, $0 \le y2 \le 1$, $0 \le x5+y2 \le 1$) or a material selected from AlInN, AlGaAs, GaP, GaAs, GaAsP, and AlGaInP. When the second dopant is a p-type dopant such as Mg, Zn, Ca, Sr, Ba, or the like, the second conductivity-type semiconductor layer 427 doped with the second dopant may be a p-type semiconductor layer.

The light emitting structure 420 may include a plurality of recesses 428.

The plurality of recesses 428 may be disposed from a lower surface of the second conductivity type semiconductor layer 427 to a partial region of the first conductivity type semiconductor layer 424 through the active layer 426. A first insulating layer 431 may be disposed inside the recess 428 to electrically insulate the first conductive layer 465 from the second conductive semiconductor layer 427 and the active layer 426.

The first electrodes 442 and 465 may include a first contact electrode 442 and a first conductive layer 465. The first contact electrode 442 may be disposed on a top surface of the recess 428 to be electrically connected to the first conductivity type semiconductor layer 424.

In the light emitting structure 420, when the aluminum composition is increased, the current dispersing characteristic in the light emitting structure 420 may be reduced. In addition, in the active layer 426, the amount of light emitted to the side surface is increased compared to a blue light emitting device based on GaN (TM mode). This TM mode may mainly occur in an ultraviolet semiconductor device.

The ultraviolet semiconductor device has an inferior current dispersing characteristic compared to the blue GaN semiconductor device. Therefore, in the ultraviolet semiconductor device, it is necessary to arrange a relatively large number of first contact electrodes 442 compared to the blue GaN semiconductor device.

A second electrode pad 466 may be disposed in a corner region of one side of the semiconductor device.

The first insulating layer 431 is partially opened from the lower portion of the second electrode pad 466 so that the second conductive layer 450 and the second contact electrode 446 may be electrically connected.

A passivation layer 480 may be formed on the top and side surfaces of the light emitting structure 420. The passivation layer 480 may be contacted with the first insulating layer 431 in a region adjacent to the second contact electrode 446 or at the lower portion of the second contact electrode 446.

The first insulating layer 431 may electrically insulate the first contact electrode 442 from the active layer 426 and the second conductivity type semiconductor layer 427. In addition, the first insulating layer 431 may electrically insulate the second conductive layer 450 from the first conductive layer 465.

The first insulating layer 431 may be formed by selecting at least one from the group consisting of $SiO_2$, $Si_xO_y$, $Si_3N_4$, $Si_xN_y$, $SiO_xN_y$, $Al_2O_3$, $TiO_2$, AlN, etc., but is not limited thereto. The first insulating layer 431 may be formed as a single layer or multiple layers. For example, the first insulating layer 431 may be a distributed Bragg reflector (DBR) having a multilayer structure including Si oxide or a Ti compound. However, it is not necessarily limited thereto, and the first insulating layer 431 may include various reflective structures.

When the first insulating layer 431 performs a reflective function, the light emitted from the active layer 426 toward the side surface may be reflected upward, thereby improving light extraction efficiency. In the ultraviolet semiconductor device, the light extraction efficiency may be more effective as the number of recesses 428 increases compared to a semiconductor device emitting blue light.

The second electrodes 446 and 450 may include a second contact electrode 446 and a second conductive layer 450.

The second contact electrode 446 may be contacted with the lower surface of the second conductivity type semiconductor layer 427. The second contact electrode 446 may include a conductive oxide electrode having relatively little absorption of ultraviolet light. For example, the conductive oxide electrode may be ITO, but is not limited thereto.

The second conductive layer 450 may inject current into the second conductivity type semiconductor layer 427. Further, the second conductive layer 450 may reflect light emitted from the active layer 426.

The second conductive layer 450 may cover the second contact electrode 446. Accordingly, the second electrode pad 466, the second conductive layer 450, and the second contact electrode 446 may form one electrical channel.

The second conductive layer 450 may surround the second contact electrode 446 and may be contacted to a side surface and a bottom surface of the first insulating layer 431. The second conductive layer 450 may be made of a material having good adhesion to the first insulating layer 431, and may be made of at least one material selected from the group consisting of materials such as Cr, Al, Ti, Ni, and Au, and alloys thereof. In addition, the second conductive layer 450 may be made of a single layer or a plurality of layers.

When the second conductive layer 450 is contacted with the side surface and the bottom surface of the first insulating layer 431, thermal and electrical reliability of the second contact electrode 446 may be improved. In addition, it may have a reflective function of reflecting light emitted between the first insulating layer 431 and the second contact electrode 446 upward.

The second insulating layer 432 may electrically insulate the second conductive layer 450 from the first conductive layer 465. The first conductive layer 465 may pass through the second insulating layer 432 to be electrically connected to the first contact electrode 442.

The first conductive layer 465 and a bonding layer 460 may be disposed along the lower surface of the light emitting structure 420 and the shape of the recess 428. The first conductive layer 465 may be made of a material having excellent reflectance. For example, the first conductive layer 465 may include aluminum. When the first conductive layer 465 contains aluminum, it serves to reflect light emitted from the active layer 426 upward, thereby improving light extraction efficiency.

The bonding layer 460 may include a conductive material. For example, the bonding layer 460 may include a material selected from the group consisting of gold, tin, indium, aluminum, silicon, silver, nickel, and copper, or an alloy thereof.

The conductive substrate 470 may be made of a conductive material to inject current into the first conductivity type semiconductor layer 424. For example, the conductive substrate 470 may include a metal or semiconductor material. The conductive substrate 470 may be a metal having excellent electrical conductivity and/or thermal conductivity. In this case, the heat generated during operation of the semiconductor device may be quickly released to the outside.

The conductive substrate 470 may include a material selected from the group consisting of silicon, molybdenum, silicon, tungsten, copper, and aluminum, or an alloy thereof.

The unevenness may be formed on the top surface of the light emitting structure 420. This unevenness may improve the extraction efficiency of light emitted from the light emitting structure 420. The unevenness may have a different average height depending on the UV wavelength, and in the case of UV-C, the height is about 300 nm to 800 nm, and when the average height is about 500 nm to 600 nm, the light extraction efficiency may be improved.

In the above, the semiconductor device 20 has been described as having a vertical structure, but is not limited thereto, and may be a flip chip or a horizontal structure. Likewise, the protective device 30 may have a flip chip, vertical or horizontal structure.

Figure 11:
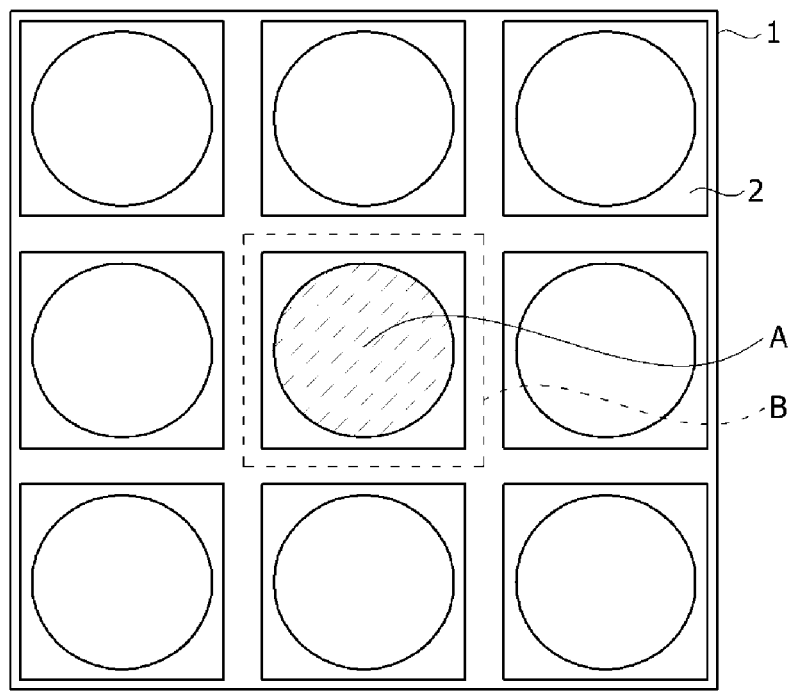
FIG. 11 is a conceptual diagram of a conventional light irradiation device.
Figure 12:
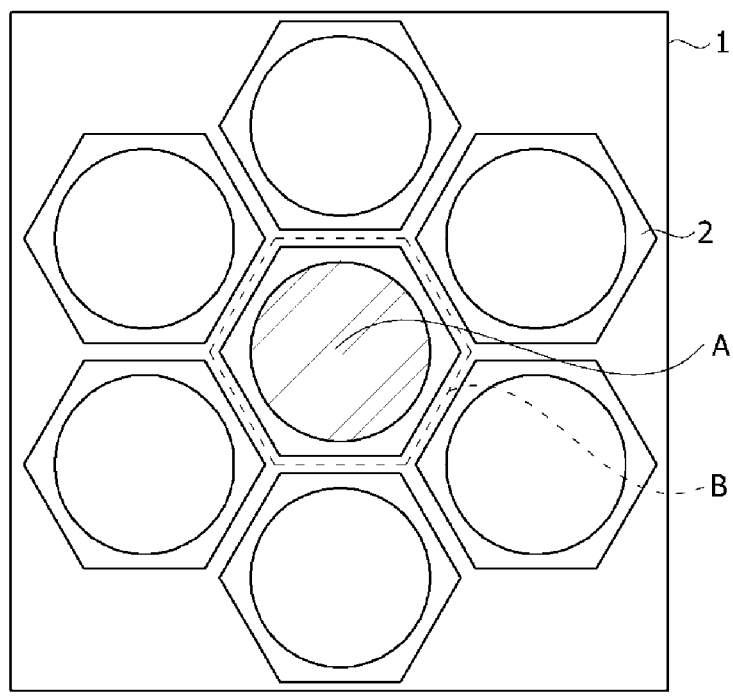
FIG. 12 is a conceptual diagram of a light irradiation device according to an embodiment of the present invention.
Figure 13:
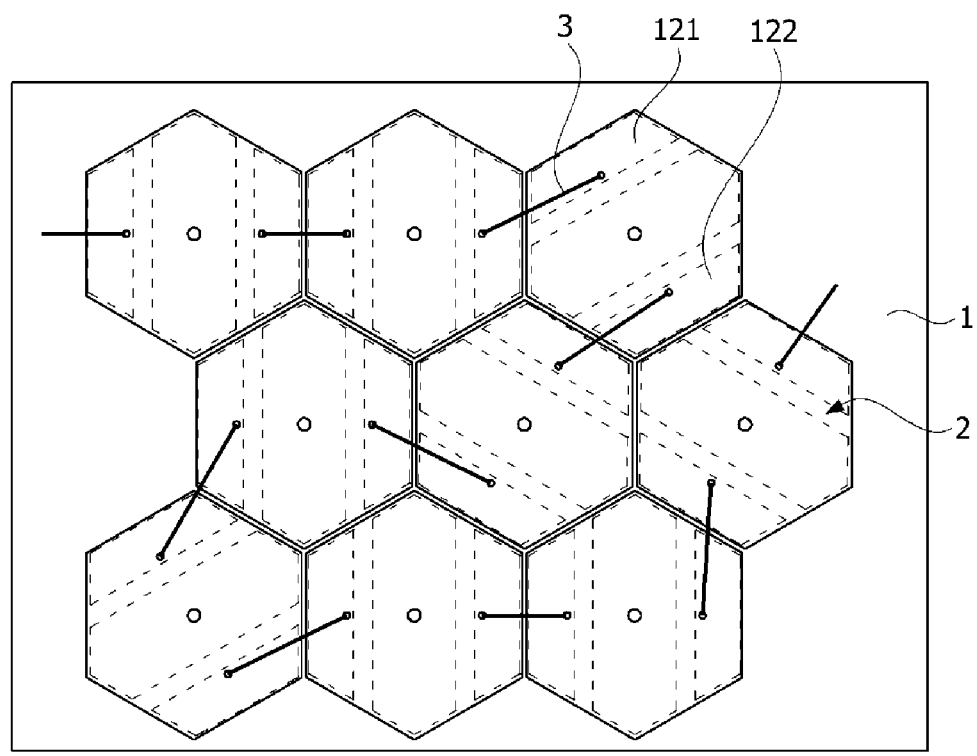
FIG. 13 is a conceptual diagram showing an electrical connection relationship of the light irradiation device according to an embodiment of the present invention.

FIG. 11 is a conceptual diagram of a conventional light irradiation device, FIG. 12 is a conceptual diagram of a light irradiation device according to an embodiment of the present invention, and FIG. 13 is a conceptual diagram showing an electrical connection relationship of the light irradiation device according to an embodiment of the present invention.

Referring to FIG. 11, in a conventional light irradiation device, a plurality of semiconductor device packages 2 may be mounted on a circuit substrate 1, and the semiconductor device packages 2 may have a rectangular shape. In this case, the maximum value of the optical effective area may be about 41.81%. The optical effective area may be defined as a value obtained by dividing the area of the cavity A by a unit area B in which the semiconductor device packages 2 are mounted.

For example, when the unit area B is 54.76 mm$^2$, the area of the cavity A, the area of the reflective member, and the area of the circuit substrate 1 of the unit area B may be 22.90 mm$^2$, 15.54 mm$^2$, and 16.32 mm$^2$, respectively.

Referring to FIG. 12, in the light irradiation device according to an embodiment of the present invention, a plurality of semiconductor device packages 2 may be mounted on a circuit substrate 1, wherein the semiconductor device packages 2 may have a hexagonal shape. In this case, the maximum value of the optical effective area may be about 55.71%. That is, the optical effective area may be formed larger than that of a conventional light irradiation device.

For example, when the unit area B is 47.42 mm$^2$, the area of the cavity A, the area of the reflective member, and the area of the circuit substrate 1 of the unit area B may be 26.42 mm$^2$, 13.62 mm$^2$, and 7.38 mm$^2$, respectively.

Referring to FIG. 13, when the plurality of semiconductor device packages 2 are mounted on a circuit substrate 1, the first pad 121 and the second pad 122 of the semiconductor device package 2 may be connected in series or in parallel to a first pad 121 and a second pad 122 of another semiconductor device package 2 through the wiring 3.

In this case, in order to enable a wiring design for interconnecting the plurality of semiconductor device packages 2 on the circuit substrate 1, the plurality of semiconductor device packages 2 may be mounted in a state rotated at different angles.

That is, when the semiconductor device package 2 has a hexagonal shape, there is a problem that the wiring design for electrical connection of a plurality of semiconductor device packages 2 becomes complicated. Since the circuit substrate 1 is common to use a metal PCB of a single-layer in consideration of heat dissipation characteristics as a result of mounting a plurality of semiconductor device packages 2, it is necessary to make the wiring design as simple as possible. Accordingly, in order to enable such wiring design, the plurality of semiconductor device packages 2 may be mounted in a state rotated at different angles when the package is mounted. Therefore, it is necessary to maintain the same optical properties of all packages according to the rotation angle of the package.

The embodiments have been described above, these are only examples and do not limit the present invention.

Accordingly, it will be appreciated that various modifications and applications not illustrated above are possible without departing from the essential characteristics of the present embodiment by those of ordinary skill in the field to which the present invention pertains. For example, each of the components specifically shown in the embodiments may be modified and implemented. In addition, the differences related to these modifications and applications should be construed as being included in the scope of the present invention defined in the appended claims.

The invention claimed is:

1. A semiconductor device package comprising:
a substrate;
an electrode disposed on the substrate;
a semiconductor device and a protective device which are disposed on the electrode;
a dummy electrode disposed on the substrate to form a closed loop and disposed to be spaced apart from the electrode along an edge of the substrate;
a reflective member disposed on the dummy electrode and having an outer surface, an inner surface surrounding the semiconductor device and forming a cavity, and a bottom surface facing the substrate; and
a light-transmitting member disposed on the reflective member and covering the cavity,
wherein the inner surface includes:
 a first surface adjacent to the substrate; and
 a second surface extending from the first surface toward the light-transmitting member and having a parabolic shape, and
wherein the bottom surface of the reflective member has a first recess disposed on the protective device between the dummy electrode and the inner surface.

2. The semiconductor device package according to claim 1, wherein the reflective member has a horizontal cross section of an outer surface including a hexagon.

3. The semiconductor device package according to claim 1, wherein the substrate has a horizontal cross section including a hexagon.

4. The semiconductor device package according to claim 1, wherein the light-transmitting member includes:
a plate unit disposed on the reflective member;
a first lens unit disposed on the plate unit; and
a second lens unit disposed on a lower portion of the plate unit, and
wherein the plate unit includes a first stepped portion on which the reflective member is disposed and the maximum diameter of the first lens unit and second lens unit is smaller than the maximum diameter of the cavity.

5. The semiconductor device package according to claim 1, wherein the electrode includes:
a first electrode disposed on the substrate and on which the semiconductor device and the protective device are disposed; and
a second electrode disposed on the substrate,
wherein the second electrode includes:
 a first wire electrically connecting the semiconductor device to the second electrode; and
 a second wire electrically connecting the protective device to the second electrode, and
wherein the second electrode is disposed to be spaced apart from the first electrode in a first direction parallel to the top surface of the substrate,
the second electrode is overlapped with the semiconductor device in the first direction, and the protective device is disposed to deviate from the semiconductor device in a second direction perpendicular to the first direction, and
the first electrode includes a groove disposed between the semiconductor device and the protective device.

6. The semiconductor device package according to claim 5, wherein the first electrode and the second electrode are overlapped with the first recess in a vertical direction, and
the side surface of the first recess is disposed to be spaced apart from the first electrode and the second electrode.

7. The semiconductor device package according to claim 5, wherein the top surface of the first recess includes a sub-recess disposed on the protective device and the second wire, and
the height from the top surface of the substrate to the top surface of the sub recess is greater than the height from the top surface of the substrate to the top surface of the first recess.

8. The semiconductor device package according to claim 5, comprising:
a first pad and a second pad disposed on the lower portion of the substrate;
a first through electrode passing through the substrate and connecting the first electrode and the first pad; and
a second through electrode passing through the substrate and connecting the second electrode and the second pad,
wherein the first pad and the second pad are symmetrically disposed with respect to a center line of the reflective member in the second direction, and
wherein the bottom surface of the reflective member includes a second recess disposed to face the first recess, and
the first electrode, the first through electrode, and the first pad are overlapped with the second recess in a vertical direction.

9. The semiconductor device package according to claim 1, wherein the bottom surface of the reflective member includes a protrusion disposed inside the dummy electrode and rotation of the reflective member is prevented by the dummy electrode.

10. A light irradiation device comprising:
a circuit substrate; and
a plurality of semiconductor device packages disposed on the circuit substrate,
wherein the semiconductor device package includes:
 a substrate;
 an electrode disposed on the substrate;
 a semiconductor device and a protective device which are disposed on the electrode;
 a dummy electrode disposed on the substrate to form a closed loop and disposed to be spaced apart from the electrode along the edge of the substrate;
 a reflective member disposed on the dummy electrode and having an outer surface, an inner surface surrounding the semiconductor device and forming a cavity, and a bottom surface facing the substrate; and
 a light-transmitting member disposed on the reflective member and covering the cavity,
 wherein the inner surface includes a first surface adjacent to the substrate and a second surface extending from the first surface toward the light-transmitting member and having a parabolic shape, and
 wherein the bottom surface of the reflective member includes a first recess disposed on the protective device between the dummy electrode and the inner surface.

11. A semiconductor device package comprising:
a substrate;
an electrode disposed on the substrate;
a semiconductor device disposed on the electrode;
a reflective member disposed to surround the semiconductor device along an outer circumference of the substrate and including an inner surface forming a cavity and a bottom surface facing the substrate; and
a light-transmitting member disposed on the reflective member and covering the cavity,
wherein the inner surface includes:
a first surface adjacent to the substrate; and
a second surface extending from the first surface toward the light-transmitting member and having a parabolic shape,
wherein the bottom surface of the reflective member includes a first recess to form a gap between the first surface and the substrate,
wherein the first electrode includes:
a first part on which the semiconductor device is disposed and disposed to be spaced apart from one side of the second electrode at a first interval;
a second part extending from an upper end of the first part and disposed to be spaced apart from the other side adjacent to one side of the second electrode at a second interval; and
a groove formed between the first part of the first electrode and the second part of the first electrode to form a predetermined space.

12. The semiconductor device package according to claim 11, wherein the light-transmitting member includes:
a plate unit disposed on the reflective member;
a first lens unit disposed on the plate unit; and
a second lens unit disposed under the plate unit,
wherein the plate unit includes a first stepped portion in which the reflective member is disposed, and
wherein the maximum diameter of the first lens unit and second lens unit is smaller than the maximum diameter of the cavity.

13. The semiconductor device package according to claim 11, wherein the electrode includes:
a first electrode on which the semiconductor device is disposed; and
a second electrode disposed to be spaced apart from the semiconductor device.

14. The semiconductor device package according to claim 13, wherein the first electrode further includes:
a protection device disposed on the second part,
wherein the semiconductor device is electrically connected to the second electrode through a first wire, and
wherein the protection device is electrically connected to the second electrode through a second wire.

15. The semiconductor device package according to claim 13, wherein the first electrode is disposed to be spaced apart from one side of the second electrode at a third interval,
wherein the second electrode includes a protection device,
wherein the semiconductor device is electrically connected to the second electrode through a third wire, and
wherein the protection element is electrically connected to the first electrode through a fourth wire.

16. The semiconductor device package according to claim 13, wherein the first electrode and the second electrode are overlapped with the first recess in a vertical direction, and
wherein a side surface of the first recess is disposed to be spaced apart from the first electrode and the second electrode.

17. The semiconductor device package according to claim 15, wherein the top surface of the first recess includes a sub-recess disposed on the protection device, and
wherein the height from the top surface of the substrate to the top surface of the sub-recess is greater than the height from the top surface of the substrate to the top surface of the first recess.

18. The semiconductor device package according to claim 13, comprising:
a first pad and a second pad disposed under the substrate;
a first through electrode passing through the substrate and connecting the first electrode and the first pad; and
a second through electrode passing through the substrate and connecting the second electrode and the second pad,
wherein the first recess is formed on the second electrode,
wherein the bottom surface of the reflective member includes a second recess formed so as to face the first recess, and
wherein the first electrode, the first through electrode, and the first pad are overlapped with the second recess in a vertical direction.

* * * * *